United States Patent
Song et al.

(10) Patent No.: US 7,465,633 B2
(45) Date of Patent: Dec. 16, 2008

(54) METHODS OF FORMING FIELD EFFECT TRANSISTORS AND CAPACITOR-FREE DYNAMIC RANDOM ACCESS MEMORY CELLS

(75) Inventors: Ki-whan Song, Seoul (KR); Chang-kyun Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/622,584

(22) Filed: Jan. 12, 2007

(65) Prior Publication Data
US 2007/0166933 A1 Jul. 19, 2007

(30) Foreign Application Priority Data
Jan. 16, 2006 (KR) .................. 10-2006-0004439

(51) Int. Cl.
*H01L 21/336* (2006.01)
*H01L 21/46* (2006.01)
*H01L 21/265* (2006.01)

(52) U.S. Cl. ............... 438/289; 438/455; 438/458; 438/459; 438/520; 257/E21.568

(58) Field of Classification Search ......... 438/197, 438/286, 455, 458, 459; 257/E21.568
See application file for complete search history.

(56) References Cited

U.S. PATENT DOCUMENTS

| | | | | |
|---|---|---|---|---|
| 5,376,559 A | * | 12/1994 | Mukai et al. | 438/283 |
| 6,346,446 B1 | * | 2/2002 | Ritenour | 438/283 |
| 2001/0000411 A1 | * | 4/2001 | Hwang et al. | 257/173 |
| 2003/0170990 A1 | * | 9/2003 | Sakaguchi et al. | 438/690 |
| 2004/0075143 A1 | * | 4/2004 | Bae et al. | 257/347 |
| 2005/0077574 A1 | * | 4/2005 | Mouli | 257/347 |
| 2006/0157687 A1 | * | 7/2006 | Doyle et al. | 257/19 |
| 2006/0183318 A1 | * | 8/2006 | Liu et al. | 438/634 |
| 2007/0252175 A1 | * | 11/2007 | Tang et al. | 257/213 |

FOREIGN PATENT DOCUMENTS

| | | |
|---|---|---|
| JP | 08-213624 | 8/1996 |
| JP | 2003-031696 | 1/2003 |
| KR | 100257765 B1 | 3/2000 |

OTHER PUBLICATIONS

Glossary, http://www.jaeri.go.jp/english/press/990902/fig04.html, Printed Oct. 26, 2006.

* cited by examiner

*Primary Examiner*—Hsien Ming Lee
*Assistant Examiner*—Kevin A Parendo
(74) *Attorney, Agent, or Firm*—Myers Bigel Sibley & Sajovec

(57) ABSTRACT

Methods of forming capacitor-free DRAM cells include forming a field effect transistor by forming a first semiconductor wafer having a channel region protrusion extending therefrom and surrounding the channel region protrusion by an electrical isolation region. A portion of a backside of the first semiconductor wafer is then removed to define a semiconductor layer having a primary surface extending opposite the channel region protrusion and the electrical isolation region. A gate electrode is formed on the primary surface. The gate electrode extends opposite the channel region protrusion. The source and drain regions are formed in the semiconductor layer, on opposite sides of the gate electrode.

16 Claims, 4 Drawing Sheets

US 7,465,633 B2

METHODS OF FORMING FIELD EFFECT TRANSISTORS AND CAPACITOR-FREE DYNAMIC RANDOM ACCESS MEMORY CELLS

CROSS-REFERENCE TO RELATED APPLICATION

This application claims priority to Korean Patent Application No. 10-2006-0004439, filed Jan. 16, 2006, the disclosure of which is hereby incorporated herein by reference.

FIELD OF THE INVENTION

The present invention relates to integrated circuit fabrication methods and, more particularly, to methods of forming field effect transistors.

BACKGROUND OF THE INVENTION

Conventional dynamic random access memory (DRAM) cells typically utilize a single capacitor (1C) to retain charge representing a "1" or "0" data value and one transistor (1T) having a current carrying terminal (e.g., source terminal) connected to an electrode of the capacitor and a gate terminal connected to a word line. This transistor is frequently referred to as a memory cell access transistor.

More recently, DRAM fabrication techniques have been proposed to reduce a complexity of fabricating conventional 1T/1C DRAM devices. These techniques include methods of forming capacitor-free DRAM cells. FIG. 1 is a cross-sectional view of a capacitor-free DRAM cell according to the prior art. As illustrated by FIG. 1, a relatively high voltage may be applied to a gate region 20 and a drain region 11 of a cell transistor to thereby cause impact ionization within a channel region 13 of the transistor. This ionization can result in the generation of a relatively high concentration of electron-hole pairs. This generation of electron-hole pairs may result in the accumulation of excess holes 1 within the channel region 13 of the cell transistor. These excess holes 1 may also be confined within the channel region 13 by using an oxide barrier layer 10 as an underlying layer that spans the source region 12, the channel region 13 and the drain region 11. This confinement of excess holes 1 may be treated as a form of charge storage that represents a logic 1 value in the DRAM cell.

Unfortunately, because a quantity of the excess holes 11 naturally decays in response to electron-hole recombination in the channel region 13, the cell transistor must be periodically refreshed to reestablish the necessary quantity of holes to reflect the stored logic 1 value. This requirement of periodic refreshing can limit the operation of a capacitor-free DRAM device, particularly if the rate at which refresh operations must be performed to reliably store data becomes excessive. One technique for reducing the refresh rate includes increasing the average retention time (i.e., lifetime) of excess holes in the channel region of a capacitor-free DRAM cell.

SUMMARY OF THE INVENTION

Methods of forming field effect transistors according to embodiments of the present invention yield channel regions with improved charge retention characteristics. These methods include forming a field effect transistor by forming a first semiconductor wafer having a channel region protrusion (e.g., channel region post, fin, . . . ) extending therefrom that is surrounded by an electrical isolation region. A portion of a backside of the first semiconductor wafer is then removed to define a semiconductor layer having a primary surface extending opposite the channel region protrusion and the electrical isolation region. A gate electrode is formed on the primary surface. The gate electrode extends opposite the channel region protrusion. The source and drain regions are formed in the semiconductor layer, on opposite sides of the gate electrode.

The step of forming the first semiconductor wafer with the channel region protrusion and the electrical isolation region includes selectively etching a front side of the first semiconductor wafer to define the channel region protrusion having exposed sidewalls and then depositing an electrically insulating layer on the exposed sidewalls of the channel region protrusion. A portion of the electrically insulating layer is then removed to thereby define the electrical isolation region. This removing of the electrically insulating layer includes planarizing the electrically insulating layer to define a planarized surface of the electrical isolation region.

According to some additional embodiments of the invention, the removing a portion of the backside of the first semiconductor wafer is preceded by bonding a second semiconductor wafer on the planarized surface. This second semiconductor wafer may be electrically insulated from the channel region protrusion. In particular, the removing a portion of the backside of the first semiconductor wafer may include delaminating the portion of the backside of the first semiconductor wafer to thereby expose the semiconductor layer. This delaminating may be preceded by a step of implanting hydrogen ions into the front side of the first semiconductor wafer to define a hydrogen-enhanced semiconductor layer buried within the first semiconductor wafer. The delaminating may then be performed by delaminating the portion of the backside of the first semiconductor wafer along the hydrogen-enhanced semiconductor layer.

According to alternative embodiments of the invention, the delaminating may be preceded by a step of implanting electrically inert atoms from Group 0 of the periodic table into the front side of the first semiconductor wafer to define a buried layer having a relatively high concentration of inert atoms therein. In this case, the delaminating includes delaminating the portion of the backside of the first semiconductor wafer along the buried layer containing the electrically inert atoms.

According to still further embodiments of the invention, a method of forming a capacitor-free dynamic random access memory cell includes implanting hydrogen and/or inert atoms from Group 0 of the periodic table into a front side of a first semiconductor wafer to define a buried implant layer therein. A first electrically insulating layer pattern is formed on the front side of the semiconductor wafer. This first electrically insulating layer pattern may be formed by depositing a blanket electrically insulating layer and then photolithographically patterning the blanket electrically insulating layer. The blanket electrically insulating layer may, in some embodiments, include an oxide layer and a nitride layer.

The front side of the semiconductor wafer is selectively etched to define a channel region protrusion extending therefrom. This etching step is performed using the first electrically insulating layer pattern as an etching mask. A second electrically insulating layer is deposited on sidewalls of the channel region protrusion. This second electrically insulating layer is planarized to define an electrical isolation region surrounding the channel region protrusion. A second semiconductor wafer is then bonded on a planarized surface of the electrical isolation region. Thereafter, a portion of the backside of the first semiconductor wafer is delaminated (along the buried implant layer) to thereby define a remaining semiconductor layer having a primary surface extending opposite the channel region protrusion and the electrical isolation region. Steps to form a field effect transistor are then performed in the semiconductor layer. In particular, a gate electrode is formed on the primary surface. This gate electrode is positioned to extend opposite the channel region protrusion. Source and drain regions of first conductivity type are also formed in the semiconductor layer. These source and drain regions are formed on opposite sides of the gate electrode.

DETAILED DESCRIPTION OF PREFERRED EMBODIMENTS

Figure 1:
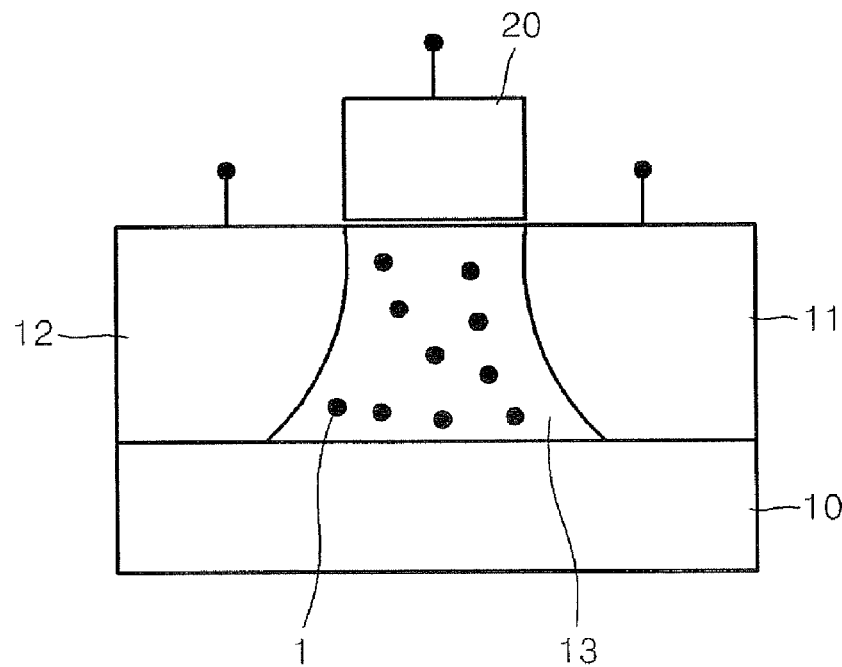
FIG. 1 is a cross-sectional view of a conventional capacitor-free dynamic random access memory (DRAM) cell.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Moreover, the terms "first conductivity type" and "second conductivity type" refer to opposite conductivity types such as N or P-type, however, each embodiment described and illustrated herein includes its complementary embodiment as well. Like numbers refer to like elements throughout.

Figure 2A:
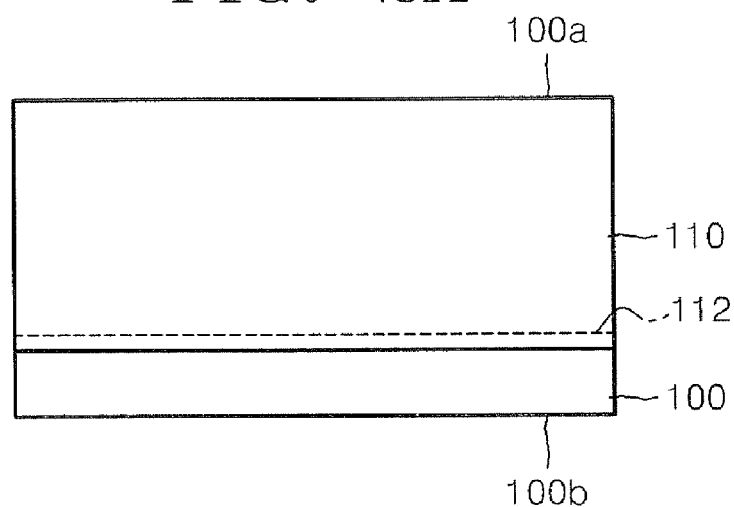
FIGS. 2A-2H are cross-sectional views of intermediate structures that illustrated methods of forming field effect transistors that may be used in capacitor-free DRAM cells, according to embodiments of the present invention.

Referring now to FIG. 2A, methods of forming a capacitor-free DRAM cell according to embodiments of the present invention may include forming a first impurity region 110 (e.g., P-type region) in a first semiconductor substrate 100 (e.g, N-type wafer). This first impurity region 110 may be formed by implanting dopants of a predetermined conductivity type into a first surface 100a of the first substrate 100 and then performing an annealing step to drive-in and diffuse the implanted dopants therein. These steps may result in the first impurity region 110 having a dopant profile therein that decreases in a direction extending from the first surface 100a to a second surface 100b. The first surface 100a may be a front side surface of a first semiconductor wafer and the second surface 100b may be a backside surface of the first semiconductor wafer.

Thereafter, a relatively deep buried implant layer 112 may be formed in the first substrate 100 by implanting hydrogen ions (e.g., H+) at a relatively high implant energy into the first surface 100a of the first substrate 100. Alternatively, the buried implant layer 112 may be formed by implanting noble gas ions from Group 0 of the periodic chart into the first surface 100a. In particular, the hydrogen ions and/or noble gas ions may be implanted at a sufficient energy so that the buried implant layer 112 is formed adjacent a bottom interface (e.g., P-N junction interface) between the first impurity region 110 and the first substrate 100, as illustrated.

Figure 2B:
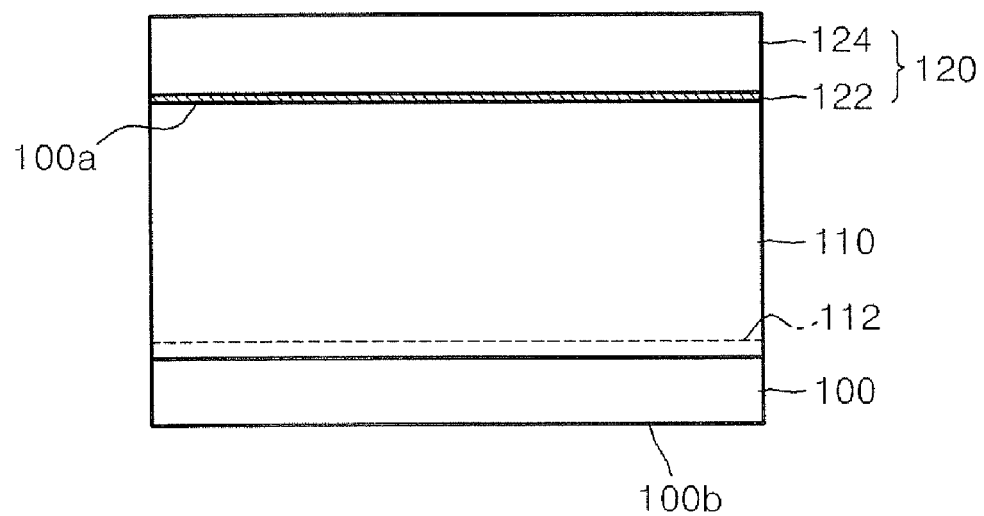

Referring now to FIG. 2B, a mask layer 120 may be formed on the first surface 100a. This mask layer 120 may be formed by vapor deposition (e.g., CVD) or by another deposition technique. The mask layer 120 may be a composite of a relatively thin oxide layer 122 and a thicker hard mask layer 124. This hard mask layer 124 may be formed as a nitride layer, for example. The thickness of the mask layer 120 may vary according to application and other design considerations relating to the magnitude of the back gate voltage applied to the completed DRAM cell during programming (or refresh) operations.

Figure 2C:
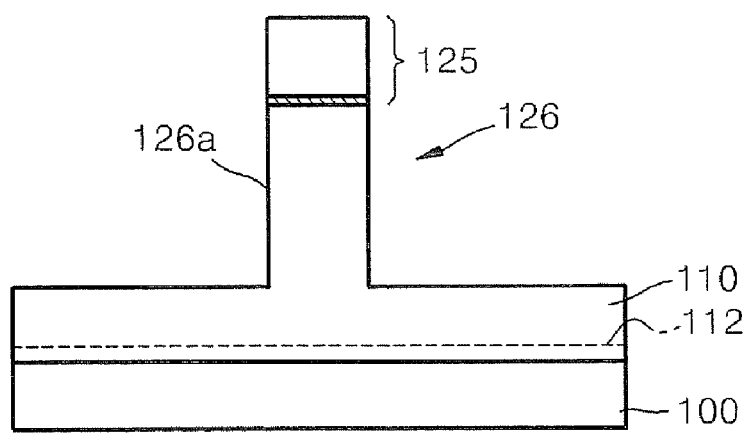

Referring now to FIG. 2C, the mask layer 120 may be photolithographically defined to yield a first electrically insulating layer pattern (i.e., a mask pattern) 125. This mask pattern 125 may then be used as an etching mask during a step to selectively etch back the first impurity region 110. This step of etching back the first impurity region 110 may be performed as a wet etching step, for example. As illustrated, the step of etching back the first impurity region 110 results in the formation of a channel region protrusion 126 have exposed sidewalls 126a. This channel region protrusion 126 may have a vertical height in a range from about 300 Å to about 1000 Å. Upon completion of the etching step, the remaining thickness of the first impurity region 110 (i.e., below the protrusion 126) may be in a range from about 300 Å to about 1000 Å. As described more fully hereinbelow with respect to FIGS. 2G-2H, the remaining portion of the first impurity region 110 may be used to support source and drain regions of a field effect transistor.

Figure 2D:
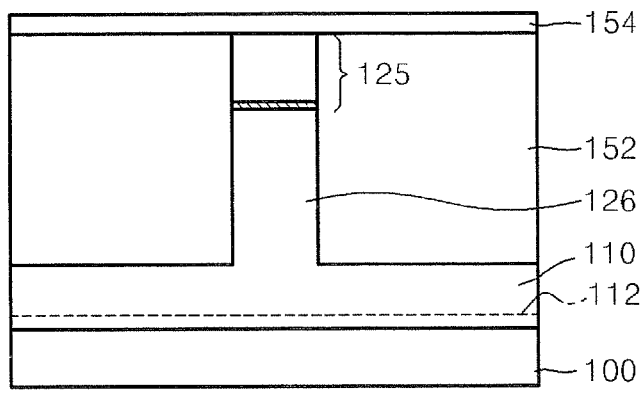

As illustrated by FIG. 2D, a second electrically insulating layer is then formed on sidewalls of the channel region protrusion 126 and on an upper surface of the mask pattern 125. This second electrically insulating layer, which may be deposited using a vapor deposition technique, for example, may be formed of an oxide material. Thereafter, the second electrically insulating layer is planarized for a sufficient duration to define an electrical isolation region 152, which surrounds the channel region protrusion 126. This planarization step may be performed as a chemical-mechanical polishing (CMP) step, which uses the upper surface of the mask pattern 125 as an planarization stop. Thereafter, an electrically insulating adhesion layer 154 (optional) may be formed on the planarized upper surfaces of the electrical isolation region 152 and mask pattern 125.

Figure 2E:
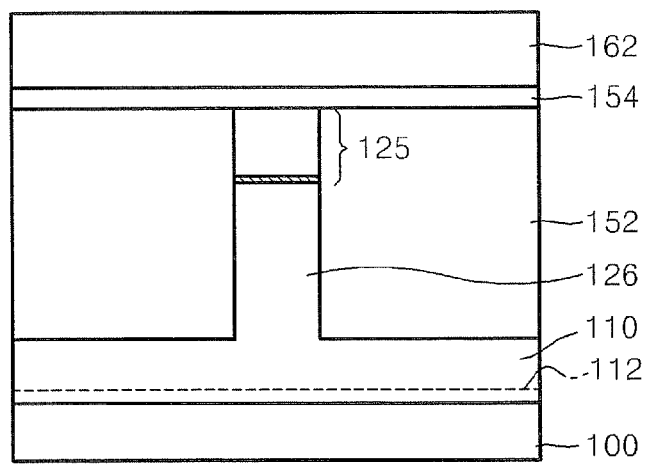
Figure 2F:
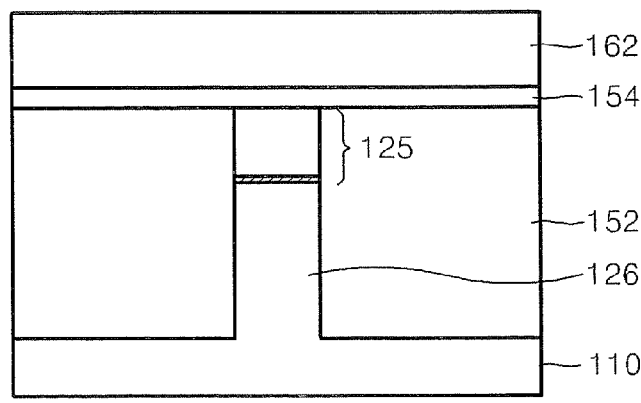
Figure 2G:
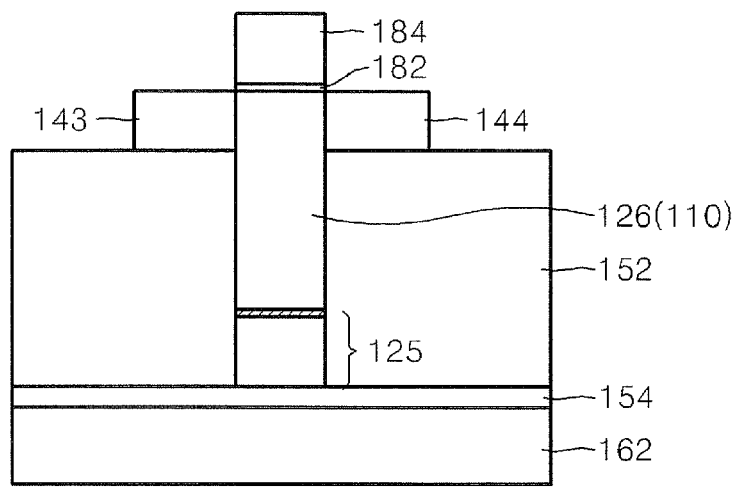
Figure 2H:
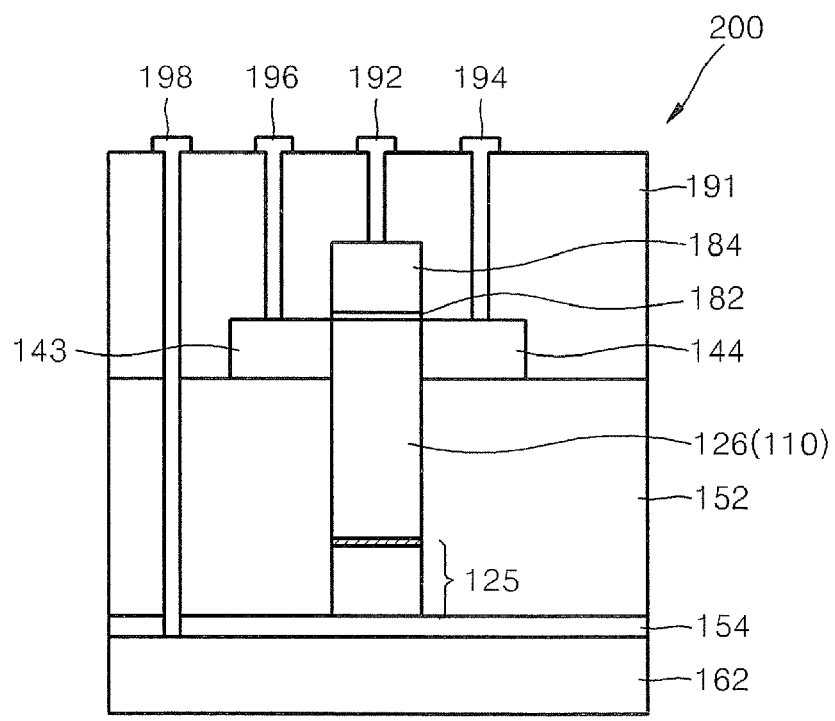

As will be understood by those skilled in the art, the combined thickness of the mask pattern 125 and the adhesion layer 154 influences the data retention time within the channel region protrusion 126, when the channel region protrusion 126 is used as a channel region of a capacitor-free DRAM cell, as illustrated by FIG. 2H. If the combined thickness is too large, then the data retention time will typically become too small. However, if the combined thickness is too small, then the mask pattern 125 and adhesion layer 154 may be too highly influenced by variations in the fabrication process. Preferably, the combined thickness is in a range from about 100 Å to about 500 Å to achieve an appropriate balance between data retention time and process variations.

Referring now to FIG. 2E, a second substrate 162 (e.g., second semiconductor wafer) may be bonded to the adhesion layer 154 using conventional wafer bonding techniques, which typically include heat treatment within a processing chamber (e.g., furnace). Referring now to FIG. 2F, a delamination step is performed on the first substrate 100 (e.g, first semiconductor wafer) along the buried implant layer 112, to thereby expose the first impurity region 110 and define a relatively thin semiconductor layer. This delamination step may be performed using a Smart-Cut™ method. The Smart- Cut™ method may include forming the buried implant layer 112, as described above, and then heat treating the buried implant layer 112 to facilitate subsequent delamination. Alternatively, the first impurity region 110 may be exposed by grinding off a sufficient portion of a backside of the first substrate 100 using conventional wafer grinding techniques.

As illustrated by FIG. 2G, the second substrate 162 may be used as a supporting substrate and the channel region protrusion 126, which contains a portion of the first impurity region 110 therein, and the thin semiconductor layer, which may be defined to have a width greater than a width of the channel region protrusion 126,may collectively define a silicon-on-insulator (SOI) region. An insulated gate electrode pattern may be formed on the thin semiconductor layer using conventional techniques. As illustrated, the insulated gate electrode pattern includes a gate electrode 184 and a gate insulating layer 182. Source and drain regions 143 and 144 may be formed by implanting source an drain region dopants (e.g., N-type dopants) into the thin semiconductor layer using the gate electrode as an implant mask. These source and drain regions 143 and 144 may have doping profiles (e.g., N-type profiles) that decrease in a downward direction towards the electrical isolation region 152. These source and drain regions 143 and 144 define respective P-N junctions with a channel region that extends opposite the gate electrode and forms a non-rectifying junction with the underlying channel region protrusion 126, as illustrated. However, because the P-N junction interface area between the channel region protrusion 126 and the source and drain regions 143 and 144 is considerably smaller than the total volume of the channel region protrusion 126, the average retention time (i.e., lifetime) of excess holes in the channel region protrusion 126 can be increased.

Referring now to FIG. 2H, an inter-layer isolation layer 191 is formed on the transistor structure illustrated by FIG. 2G. In some embodiments of the invention, the inter-layer isolation layer 191 may be formed as an oxide layer that is deposited using a conventional deposition process. Contact openings may then be formed in the inter-layer isolation layer 191, to expose the source and drain regions 143 and 144 and the gate electrode 184. These openings may be filled with respective source and drain contacts 196 and 194 and a gate contact 192. In addition, a relatively deep contact opening may be formed that extends through the inter-layer isolation layer 191, the electrical isolation region 152 and the adhesion layer 154 (optional). This deep contact opening may be filled with a back-gate terminal 198, which is electrically connected to the second substrate 162 (e.g., bulk substrate region within the second wafer). This back-gate terminal 198 may be biased at a voltage level that increases the average retention time of excess holes in the channel region protrusion 126 during operation of the capacitor-free DRAM cell 200.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a field effect transistor, comprising:
   forming a first semiconductor wafer having a channel region protrusion extending therefrom that is surrounded by an electrical isolation region, said channel region protrusion having a first width;
   removing a portion of a backside of the first semiconductor wafer to define a semiconductor layer having a second width greater than the first width, said semiconductor layer having a primary surface extending opposite the channel region protrusion and the electrical isolation region;
   forming a gate electrode extending opposite the channel region protrusion, on the primary surface; and
   forming source and drain regions of a first conductivity type in the semiconductor layer, on opposite sides of the gate electrode, said source and drain regions defining a channel region therebetween that forms a non-rectifying junction with the channel region protrusion, which has a greater volume than the channel region.

2. The method of claim 1, wherein said forming a first semiconductor wafer comprises:
   selectively etching a front side of the first semiconductor wafer to define the channel region protrusion having exposed sidewalls that are separated from each other by the first width;
   depositing an electrically insulating layer on the exposed sidewalls of the channel region protrusion; and
   removing a portion of the electrically insulating layer to thereby define the electrical isolation region.

3. The method of claim 2, wherein said removing a portion of the electrically insulating layer comprises planarizing the electrically insulating layer to define a planarized surface of the electrical isolation region.

4. The method of claim 3, wherein said removing a portion of the backside of the first semiconductor wafer is preceded by bonding a second semiconductor wafer on the planarized surface.

5. The method of claim 4, wherein the second semiconductor wafer is electrically insulated from the channel region protrusion.

6. The method of claim 4, wherein said forming source and drain regions comprises implanting source and drain region dopants into the semiconductor layer, using the gate electrode as an implant mask.

7. The method of claim 2, wherein said removing a portion of the backside of the first semiconductor wafer comprises delaminating the portion of the backside of the first semiconductor wafer to thereby expose the semiconductor layer.

8. The method of claim 4, wherein said removing a portion of the backside of the first semiconductor wafer comprises delaminating the portion of the backside of the first semiconductor wafer to thereby expose the semiconductor layer.

9. The method of claim 8, wherein said selectively etching a front side of the first semiconductor wafer is preceded by implanting hydrogen ions into the front side of the first semiconductor wafer to define a hydrogen-enhanced semiconductor layer buried within the first semiconductor wafer; and wherein said delaminating comprises delaminating the portion of the backside of the first semiconductor wafer along the hydrogen-enhanced semiconductor layer.

10. The method of claim 8, wherein said selectively etching a front side of the first semiconductor wafer is preceded by implanting electrically inert atoms from Group 0 of the periodic table into the front side of the first semiconductor wafer to define a buried layer having a concentration of inert atoms therein; and wherein said delaminating comprises delaminating the portion of the backside of the first semiconductor wafer along the buried layer.

11. A method of forming a capacitor-free dynamic random access memory cell, comprising:
   implanting hydrogen and/or inert atoms from Group 0 of the periodic table into a front side of a first semiconductor wafer to define a buried implant layer therein;

forming a first electrically insulating layer pattern on the front side of the semiconductor wafer;

selectively etching the front side of the semiconductor wafer to define a channel region protrusion having a first width extending therefrom, using the first electrically insulating pattern as an etching mask;

depositing a second electrically insulating layer on sidewalls of the channel region protrusion;

planarizing the second electrically insulating layer to thereby define an electrical isolation region surrounding the channel region protrusion;

bonding a second semiconductor wafer on a planarized surface of the electrical isolation region;

delaminating a portion of a backside of the first semiconductor wafer to define a semiconductor layer having a primary surface extending opposite the channel region protrusion and the electrical isolation region, said first semiconductor wafer defined to have a second width greater than the first width;

forming a gate electrode extending opposite the channel region protrusion, on the primary surface; and forming source and drain regions of first conductivity type in the semiconductor layer, on opposite sides of the gate electrode, said source and drain regions defining a channel region therebetween that forms a non-rectifying junction with the channel region protrusion, which has a greater volume than the channel region and operates as a charge storage region within the capacitor-free dynamic random access memory cell.

12. The method of claim 11, wherein said delaminating comprises delaminating the portion of the backside of the first semiconductor wafer along the buried implant layer.

13. The method of claim 11, wherein said depositing a second electrically insulating layer comprises depositing the second electrically insulating layer on the first electrically insulating pattern; and wherein said planarizing comprises planarizing the second electrically insulating layer using the first electrically insulating pattern as a planarization stop layer.

14. The method of claim 13, wherein said bonding comprises bonding the second semiconductor wafer on the first electrically insulating pattern.

15. The method of claim 14, wherein the first electrically insulating pattern comprises a composite of nitride and oxide regions.

16. The method of claim 11, further comprising:
depositing an inter-layer isolation layer on the source and drain regions; and
forming a contact hole that extends through the inter-layer isolation layer and the electrical isolation region and exposes a portion of the second semiconductor wafer.

* * * * *